US011189649B2

(12) United States Patent
Iwakura et al.

(10) Patent No.: US 11,189,649 B2
(45) Date of Patent: Nov. 30, 2021

(54) PHOTOELECTRIC CONVERSION APPARATUS AND IMAGE PICKUP SYSTEM

(71) Applicant: CANON KABUSHIKI KAISHA, Tokyo (JP)

(72) Inventors: Yasushi Iwakura, Kawaguchi (JP); Tomoya Onishi, Ayase (JP)

(73) Assignee: Canon Kabushiki Kaisha, Tokyo (JP)

( * ) Notice: Subject to any disclaimer, the term of this patent is extended or adjusted under 35 U.S.C. 154(b) by 10 days.

(21) Appl. No.: 16/707,217

(22) Filed: Dec. 9, 2019

(65) Prior Publication Data
US 2020/0185435 A1 Jun. 11, 2020

(30) Foreign Application Priority Data

Dec. 11, 2018 (JP) .............................. JP2018-231926

(51) Int. Cl.
*H01L 27/146* (2006.01)
*H04N 3/14* (2006.01)

(52) U.S. Cl.
CPC .. *H01L 27/14603* (2013.01); *H01L 27/14609* (2013.01); *H04N 3/15* (2013.01); *H01L 27/14641* (2013.01)

(58) Field of Classification Search
CPC ......... H01L 27/14603; H01L 27/14609; H01L 27/14641; H04N 3/15
USPC ........................................................ 257/88
See application file for complete search history.

(56) References Cited

U.S. PATENT DOCUMENTS

| 8,564,706 | B2 | 10/2013 | Sugiyama et al. |
| 9,142,575 | B2 | 9/2015 | Kobayashi et al. |
| 9,894,308 | B2 | 2/2018 | Onishi et al. |
| 9,900,532 | B2 | 2/2018 | Takado et al. |
| 9,924,121 | B2 | 3/2018 | Onishi |
| 10,356,286 | B2 | 7/2019 | Ito et al. |
| 10,368,041 | B2 | 7/2019 | Iwakura et al. |
| 10,382,714 | B2 | 8/2019 | Michimata et al. |
| 2001/0002045 | A1 | 5/2001 | Fossum et al. |
| 2001/0002848 | A1 | 6/2001 | Fossum et al. |
| 2001/0040635 | A1 | 11/2001 | Fossum et al. |

(Continued)

FOREIGN PATENT DOCUMENTS

JP 2010-157893 A 7/2010

OTHER PUBLICATIONS

U.S. Appl. No. 16/722,646, filed Dec. 20, 2019 (First Named Inventor: Tomoya Onishi).

*Primary Examiner* — Tu-Tu V Ho
(74) *Attorney, Agent, or Firm* — Venable LLP

(57) ABSTRACT

A photoelectric conversion apparatus, comprising: a photoelectric conversion unit; a charge accumulation unit configured to accumulate charges generated in the photoelectric conversion unit; and a transfer transistor configured to connect the photoelectric conversion unit and the charge accumulation unit to each other and to perform a transfer operation of a charge from the photoelectric conversion unit to the charge accumulation unit, wherein the photoelectric conversion apparatus outputs: a first signal obtained by performing an on-off operation of the transfer transistor a plurality of times in a state where the charge accumulation unit is accumulating charges; and a second signal obtained by performing an on-off operation of the transfer transistor a plurality of times in a state where the charge accumulation unit is not accumulating charges.

17 Claims, 10 Drawing Sheets

(56) References Cited

U.S. PATENT DOCUMENTS

| | | |
|---|---|---|
| 2016/0330414 A1 | 11/2016 | Takado et al. |
| 2017/0359535 A1 | 12/2017 | Kobayashi et al. |
| 2018/0097960 A1 | 4/2018 | Ochiai et al. |
| 2018/0098012 A1 | 4/2018 | Takado et al. |
| 2018/0213219 A1 | 7/2018 | Kono et al. |
| 2019/0360863 A1* | 11/2019 | Tang .................... G01J 1/46 |

* cited by examiner

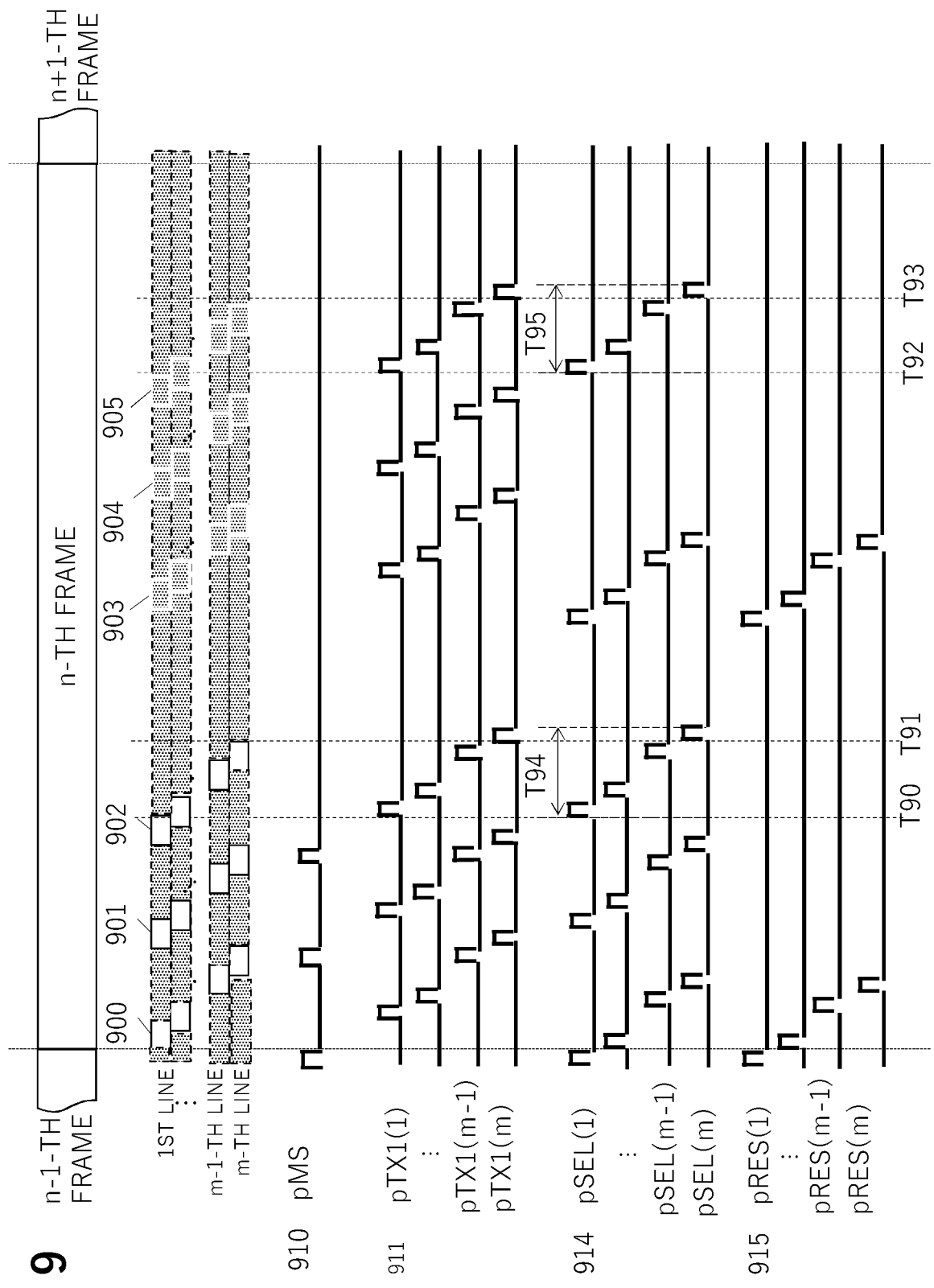

PHOTOELECTRIC CONVERSION APPARATUS AND IMAGE PICKUP SYSTEM

BACKGROUND OF THE INVENTION

Field of the Invention

The present invention relates to a photoelectric conversion apparatus and an image pickup system.

Description of the Related Art

When picking up an image of a subject including a light-emitting device (for example, a light-emitting diode (LED)) which repetitively blinks or repeats brightness variations during a short period visually imperceptible to the human eye with a solid-state image pickup apparatus, a so-called flicker phenomenon is known to occur in which excesses and deficiencies of exposure are created in an image picked up by the solid-state image pickup apparatus. As a method of suppressing the flicker phenomenon, a driving method is known in which intermittent exposure is performed a plurality of times during an exposure period in which an image is acquired per line or per frame, signals generated by the plurality of exposures are added, and the added signal is handled as a signal corresponding to the image per line or per frame.

Japanese Patent Application Laid-open No. 2010-157893 describes a driving method in which a generated charge is transferred a plurality of times to a charge accumulation unit from a photoelectric conversion unit which converts incident light into a charge and the charges transferred a plurality of times are added and accumulated by the charge accumulation unit.

When transferring a charge from the photoelectric conversion unit to the charge accumulation unit, a transfer transistor is operated. When the transfer transistor is operated, false signal (aliasing) occurs and a part of the false signal is added to the charge accumulation unit. When the transfer transistor is operated a plurality of times, false signals generated in accordance with the operations are added by the charge accumulation unit and signal noise characteristics deteriorate.

SUMMARY OF THE INVENTION

In consideration thereof, an object of the present invention is to provide a photoelectric conversion apparatus that enables a high-quality signal to be acquired when performing intermittent exposure a plurality of times during an exposure period.

One aspect of the present disclosure is a photoelectric conversion apparatus, comprising: a photoelectric conversion unit; a charge accumulation unit configured to accumulate charges generated in the photoelectric conversion unit; and a transfer transistor configured to connect the photoelectric conversion unit and the charge accumulation unit to each other and to perform a transfer operation of a charge from the photoelectric conversion unit to the charge accumulation unit, wherein the photoelectric conversion apparatus outputs: (1) a first signal obtained by performing an on-off operation of the transfer transistor a plurality of times in a state where the charge accumulation unit is accumulating charges; and (2) a second signal obtained by performing an on-off operation of the transfer transistor a plurality of times in a state where the charge accumulation unit is not accumulating charges.

According to the present invention, when performing intermittent exposure a plurality of times in a photoelectric conversion apparatus, a high-quality signal can be acquired from which false signal components generated in accordance with a transfer operation of a transfer transistor have been removed.

Further features of the present invention will become apparent from the following description of exemplary embodiments with reference to the attached drawings.

BRIEF DESCRIPTION OF THE DRAWINGS

FIG. 9 is a timing chart of drive of an image pickup system according to the third embodiment.

DESCRIPTION OF THE EMBODIMENTS

First Embodiment

Figure 1:
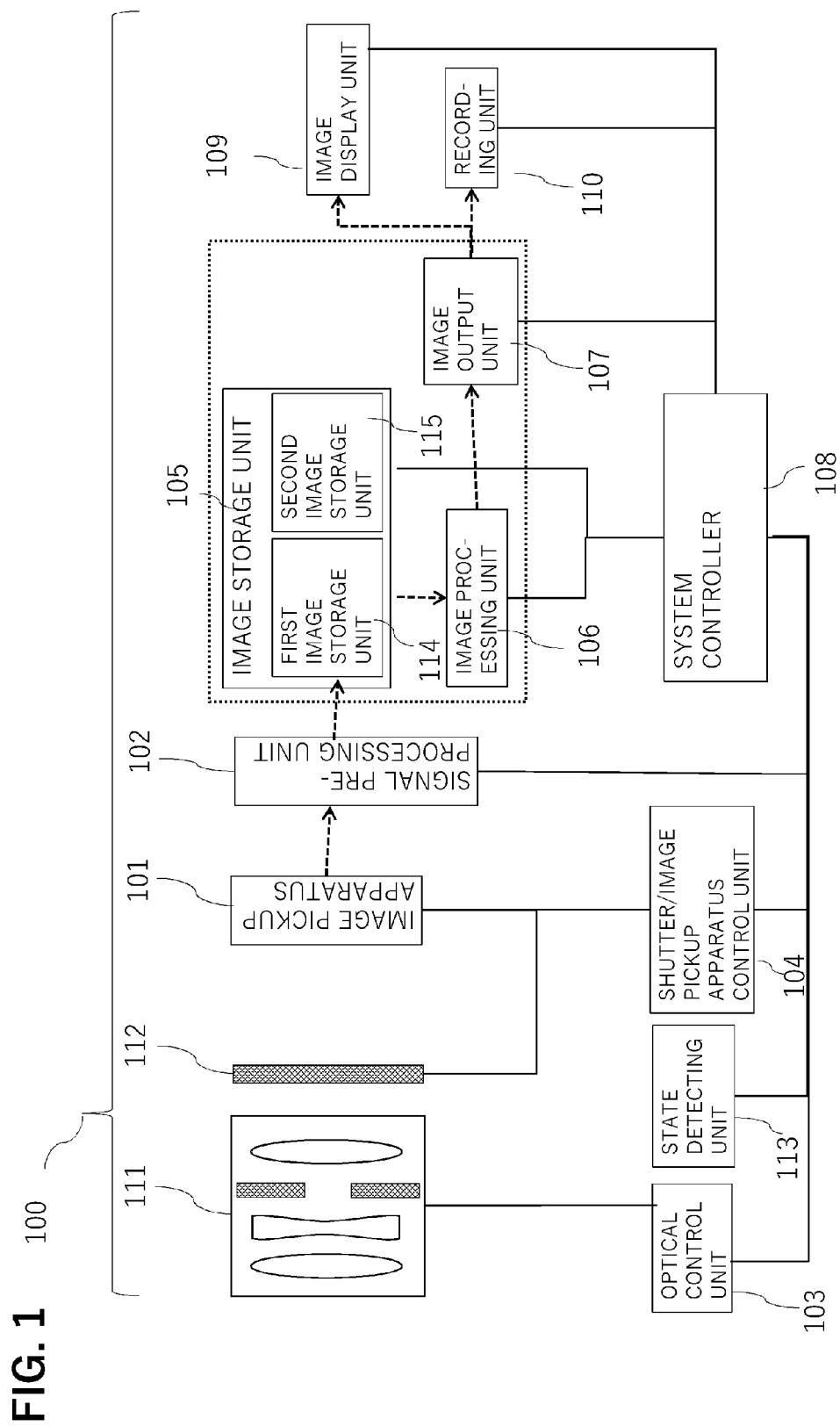
FIG. 1 is a block diagram of an image pickup system according to a first embodiment.

A specific mode of an image pickup system according to the present invention will be described with reference to the drawings. It should be noted that, in the following description and in the drawings, common components are denoted by common reference characters and descriptions thereof will be omitted when appropriate. A configuration, a driving method, and a process flow of an image pickup system according to a first embodiment of the present invention will now be described with reference to FIGS. 1 to 6.

<Block Diagram of Image Pickup System>

FIG. 1 is a block diagram of the image pickup system according to the first embodiment. An image pickup system 100 includes an image pickup apparatus (a photoelectric conversion apparatus) 101. In addition, the image pickup system 100 includes a signal preprocessing unit 102, an optical control unit 103, a shutter/image pickup apparatus control unit 104, an image storage unit 105, an image processing unit 106, an image output unit 107, a system controller 108, and a state detecting unit 113. An optical unit (an optical system) 111 and a mechanical shutter 112 are arranged on a light incidence surface side of the image pickup apparatus 101. The optical unit 111 causes an optical image of incident light to form on the image pickup apparatus 101.

The image pickup apparatus 101 converts light incident via the optical unit 111 and the mechanical shutter 112 into an electric signal. Therefore, the image pickup apparatus 101 can be considered a photoelectric conversion apparatus. An electric signal converted by the image pickup apparatus 101 is processed by the signal preprocessing unit 102. A light amount by which the image pickup apparatus 101 is irradiated is determined by the system controller 108 on the basis of input values to the optical unit 111 and the mechanical shutter 112 and optical signal strengths measured by the image pickup apparatus 101 and the state detecting unit 113. When the system controller 108 determines that the light amount by which the image pickup apparatus 101 is irradiated is out of an appropriate range, the system controller 108 adjusts an aperture value of the optical unit 111 and an operation of the mechanical shutter 112 through the optical control unit 103 and the shutter/image pickup apparatus control unit 104. The aperture value of the optical unit 111 and the operation of the mechanical shutter 112 need not be automatically adjusted and, alternatively, may be manually adjusted.

The shutter/image pickup apparatus control unit 104 controls generation of a periodic signal for synchronizing operations of the image pickup apparatus 101 and the mechanical shutter 112 as well as timings of a signal input to the image pickup apparatus 101 and a signal output from the image pickup apparatus 101.

The mechanical shutter 112 has a front curtain and a rear curtain which block incidence of light to, for example, the photoelectric conversion unit 401 (FIG. 4) and has a curtain traveling orientation in a line direction. In addition, opening and closing periods of the shutter are controlled by the shutter/image pickup apparatus control unit 104.

The signal preprocessing unit 102 subjects an electric signal acquired from the image pickup apparatus 101 to processes such as horizontal/vertical synchronization and encoding, and transmits the processed signal to the subsequent-stage image storage unit 105 as an image signal.

The image storage unit 105 includes a first image storage unit 114 and a second image storage unit 115.

The image processing unit 106 acquires image signals from the first image storage unit 114 and the second image storage unit 115 in the image storage unit 105. In addition, the image processing unit 106 performs calculation processes such as image processing and generation on the basis of the image signals acquired from both storage units.

The image output unit 107 performs, based on a processing result of the image processing unit 106, processing to a signal suitable for output to an image display unit 109 and a recording unit 110 and outputs the signal.

Figure 2:
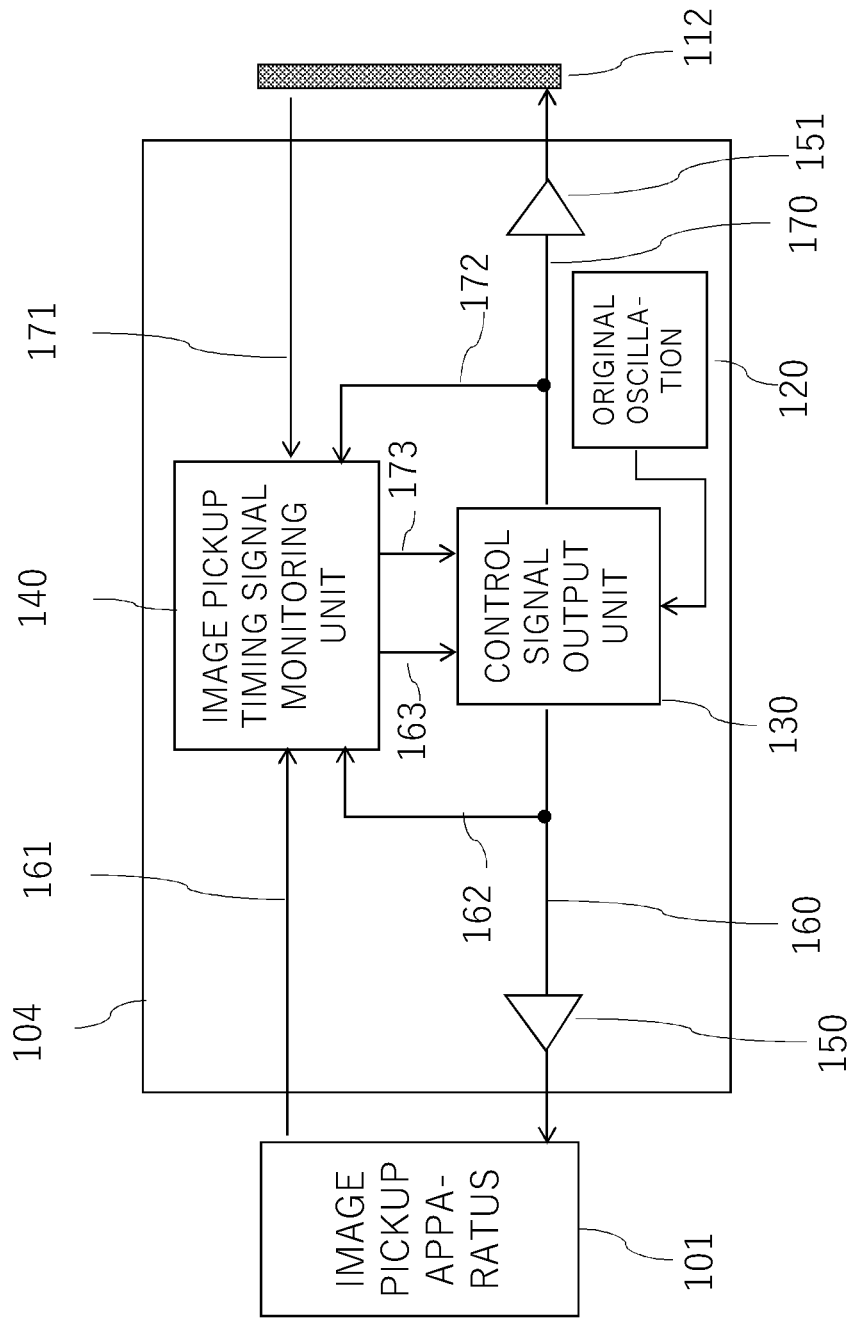
FIG. 2 is a block diagram of a mechanical shutter/image pickup apparatus control unit according to the first embodiment.

FIG. 2 illustrates the example of the shutter/image pickup apparatus control unit 104 in greater detail. The shutter/image pickup apparatus control unit 104 includes an original oscillation generating unit 120, a control signal output unit 130, and an image pickup timing signal monitoring unit 140.

The original oscillation generating unit 120 generates a periodic signal to be a basis of a control signal waveform in the control signal output unit 130.

The control signal output unit 130 is capable of outputting control signals such as timing signals that indicate a start of exposure and an end of exposure with respect to the image pickup apparatus 101 and the mechanical shutter 112.

Wiring 160 is wiring that electrically connects the control signal output unit 130 and the image pickup apparatus 101 with each other, and wiring 161 is wiring that electrically connects the image pickup timing signal monitoring unit 140 and the image pickup apparatus 101 with each other. In addition, wiring 170 is wiring that electrically connects the control signal output unit 130 and the mechanical shutter 112 with each other, and wiring 171 is wiring that electrically connects the image pickup timing signal monitoring unit 140 and the mechanical shutter 112 with each other.

In order to synchronize the image pickup apparatus 101 and the mechanical shutter 112 with high accuracy, buffer circuits 150 and 151 may be provided in a preceding stage of a control signal input terminal to the image pickup apparatus or the mechanical shutter.

The image pickup timing signal monitoring unit 140 monitors signals (a path via the wiring 161 or 171) including information on timings of a start of exposure and an end of exposure at the image pickup apparatus 101 and the mechanical shutter 112. The monitoring is performed using a control signal (a path via wiring 162 or 172) generated from the control signal output unit 130 as a reference. In addition, an adjustment of control signals to the image pickup apparatus 101 and the mechanical shutter 112 (correction of a signal delay time or a signal phase amount) with respect to the control signal output unit 130 is performed via paths of wiring 163 or 173. The adjustment is performed on the basis of a difference (a signal delay time or a phase amount) between the control signal generated from the control signal output unit 130 and signals returned from the image pickup apparatus 101 and the mechanical shutter 112.

<Block Diagram of Image Pickup Apparatus>

Figure 3:
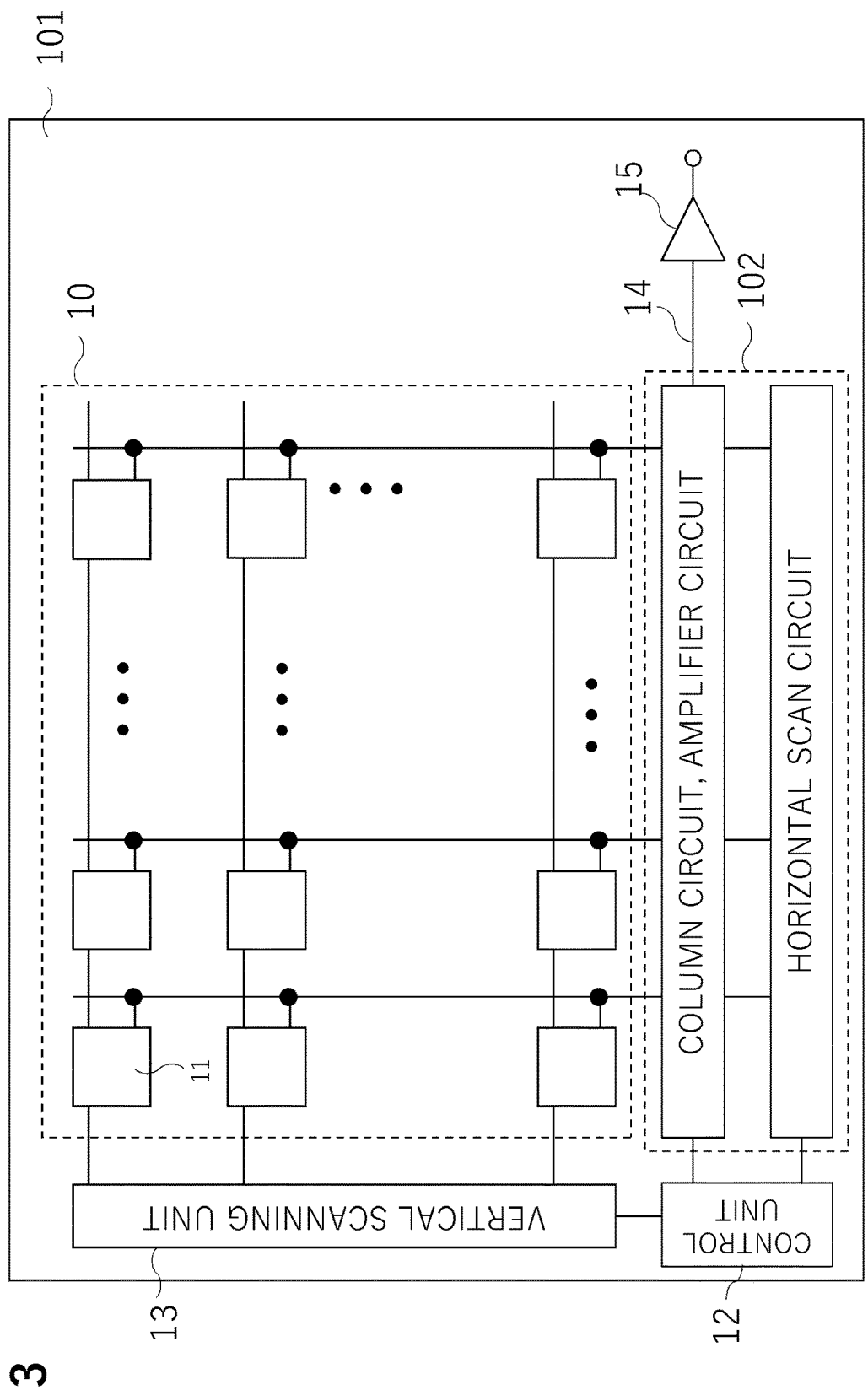
FIG. 3 is a block diagram of an image pickup apparatus and a signal preprocessing unit according to the first embodiment.

FIG. 3 is a block diagram of the image pickup apparatus 101 and the signal preprocessing unit 102 arranged in the image pickup system 100.

The image pickup apparatus 101 includes an image pickup region 10 in which a plurality of pixels 11 are two-dimensionally arranged, a control unit 12, a vertical scanning unit 13, the signal preprocessing unit 102, and an output unit 15. The control unit 12, the vertical scanning unit 13, the signal preprocessing unit 102, and the output unit 15 are arranged in an outer periphery of the image pickup region 10.

The control unit 12 supplies control signals, power-supply voltage, and the like to the vertical scanning unit 13, the signal preprocessing unit 102, and the output unit 15.

The vertical scanning unit 13 supplies a drive signal for each pixel line or for each plurality of pixel lines with respect to the plurality of pixels 11 arranged in the image pickup region 10. The vertical scanning unit 13 can be constituted by a shift register or an address decoder.

The signal preprocessing unit 102 is configured so as to include a column circuit, a horizontal scan circuit, and a horizontal output line 14. The column circuit is configured so as to include a plurality of circuits. For example, the plurality of circuits may include a signal holding circuit, an amplifier circuit, a noise elimination circuit, and an analog-digital conversion circuit. The horizontal scan circuit can be constituted by a shift register or an address decoder. A signal to be output to the horizontal output line 14 may be any of an analog signal and a digital signal.

The output unit 15 is configured so as to include a buffer circuit and transmits, to the image storage unit 105 in a subsequent stage of the image pickup apparatus 101, a signal transmitted via the horizontal output line 14.

<Equivalent Circuit Diagram of Pixel Unit>

Figure 4:
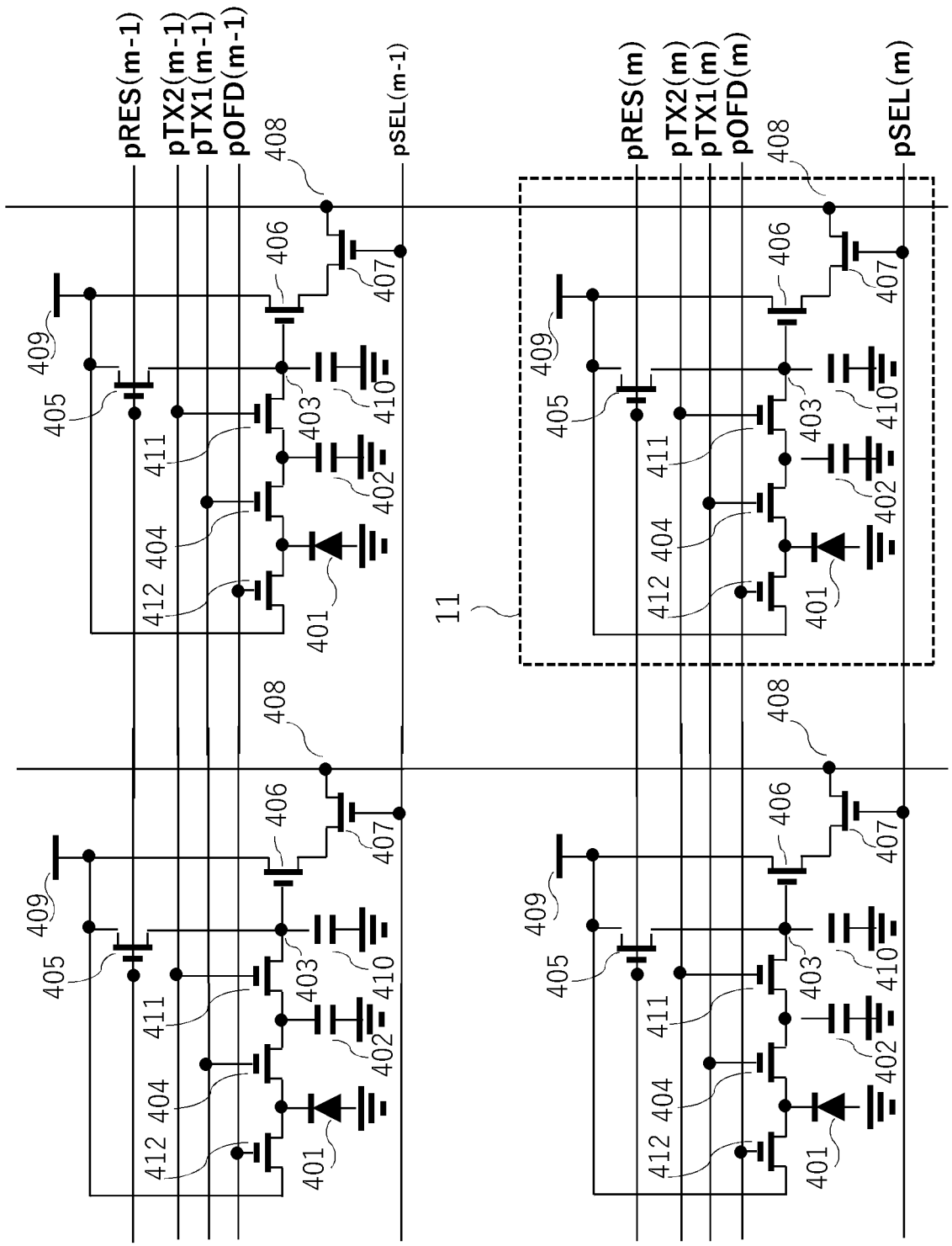
FIG. 4 is an equivalent circuit diagram of a pixel unit according to the first embodiment.

FIG. 4 shows a configuration of an equivalent circuit of the pixel 11 shown in FIG. 3. FIG. 4 shows an example constituted by four pixels. The pixel 11 includes a photoelectric conversion unit 401, a charge holding unit 402, a first transfer transistor (TX1) 404, an input node 403, a reset transistor (RST) 405, an amplifier unit 406, a selection transistor (SEL) 407, and a second transfer transistor (TX2) 411. The first transfer transistor 404 transfers a charge from the photoelectric conversion unit 401 to the charge holding unit 402. The second transfer transistor 411 transfers a charge from the charge holding unit 402 to a diffusion floating capacity (FD) 410. In addition, the pixel 11 includes an overflow drain transistor (OFD) 412 which discharges a charge from the photoelectric conversion unit 401 to a power supply 409. In the present embodiment, the charge holding unit 402 corresponds to the charge accumulation unit and the first transfer transistor 404 corresponds to a transfer transistor that performs a charge transfer operation from the photoelectric conversion unit to the charge accumulation unit. In addition, transfer transistors may also be referred to as transfer switches.

The control unit 12 performs simultaneous operation/stop control of the plurality of pixels 11, the first transfer transistors 404, the second transfer transistors 411, the reset transistors 405, the selection transistors 407, and the OFD transistors 412 arranged on the same lines. Therefore, the pluralities of the first transfer transistors 404, the second transfer transistors 411, the reset transistors 405, the selection transistors 407, and the OFD transistors 412 arranged on the same lines are connected to same control lines pTX1, pTX2, pRES, pSEL, and pOFD.

The photoelectric conversion unit 401 generates a charge using incident light and accumulates the generated charge. The photoelectric conversion unit 401 is, for example, a photodiode.

When the first transfer transistor 404 is controlled to the on-state, the first transfer transistor 404 transfers a charge generated by the photoelectric conversion unit 401 to the charge holding unit 402. A charge transfer operation by the first transfer transistor 404 is controlled by a signal supplied through the control line pSEL. The first transfer transistor 404 is, for example, a MOS transistor.

The charge holding unit 402 serves a function of receiving and holding, by an operation of the first transfer transistor 404, a charge generated by the photoelectric conversion unit 401.

The amplifier unit 406 amplifies a charge accumulated in the input node 403 of the amplifier unit 406 and outputs the amplified charge as a pixel signal to an output line 408. The amplifier unit 406 is, for example, a source follower circuit.

The selection transistor 407 selects a pixel 11 to output a signal to the output line 408.

The reset transistor 405 performs a reset operation in which a charge in the input node 403 is discharged to the power supply 409 by a signal of the control line pRES and a potential of the input node 403 is set to a potential of the power supply 409.

The FD 410 serves a function of receiving and holding, by an operation of the second transfer transistor 411, a charge accumulated in the charge holding unit 402, and constitutes the input node 403 of the amplifier unit 406.

The OFD transistor 412 connects the photoelectric conversion unit 401 and the power supply 409 to each other, and when controlled to the on-state, the OFD transistor 412 discharges a charge in the photoelectric conversion unit 401 to the power supply 409. In other words, a charge accumulation state in the photoelectric conversion unit 401 is controlled by switching the OFD transistor 412 between the on-state and the off-state. On- and off-states of the OFD transistor 412 are controlled by signals of the control line pOFD.

<Timing Chart>

Figure 5:
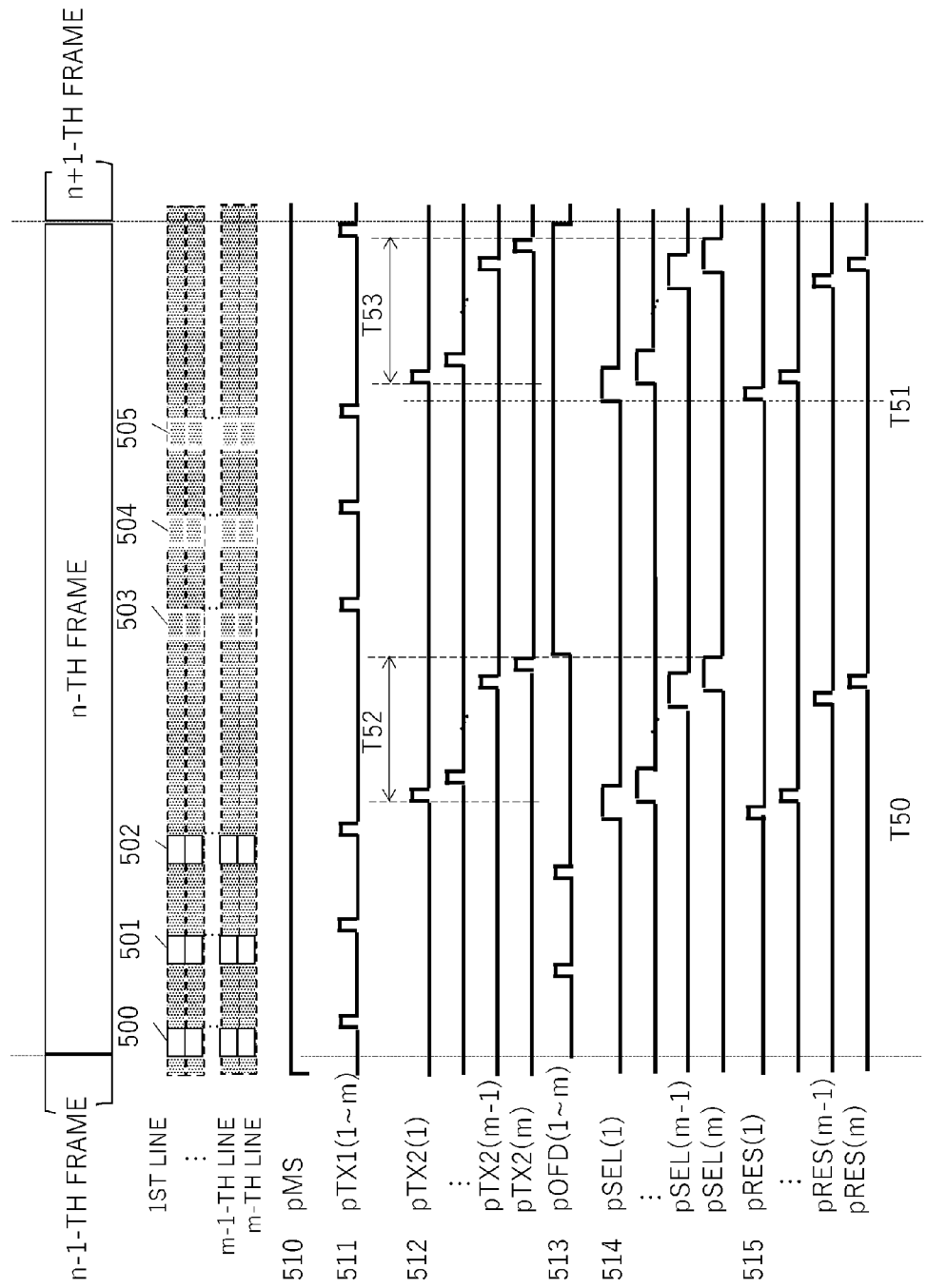
FIG. 5 is a timing chart of drive of the image pickup system according to the first embodiment.

FIG. 5 is a timing chart for explaining operations of the image pickup system 100.

Outlined rectangles 500, 501, and 502 represent exposure periods, and other periods are non-exposure periods. Outlined rectangles 503, 504, and 505 represent periods in which false signal reading in a non-exposure state is performed and which correspond to the exposure periods 500, 501, and 502. It should be noted that an exposure period refers to a period in which the photoelectric conversion unit 401 is in a state where a charge due to incident light is accumulated while a non-exposure period refers to a period in which the photoelectric conversion unit 401 is in a state where a charge due to incident light is not accumulated (including a state where there is no incident light).

A signal waveform 510 represents a waveform of a signal pMS input to the wiring 170 which connects the control signal output unit 130 with the mechanical shutter 112 in FIG. 2. When the signal pMS is input from an L level to an H level, the front curtain of the mechanical shutter starts to line-sequentially travel on an image pickup surface of the image pickup apparatus on which pixels are arranged. In addition, when the signal pMS is input from the H level to the L level, the rear curtain of the mechanical shutter starts to line-sequentially travel on the image pickup surface of the image pickup apparatus on which pixels are arranged. Therefore, during a period after the front curtain of the mechanical shutter travels on the image pickup surface and departs therefrom and before the rear curtain arrives on the image pickup surface, blocking of light by the mechanical shutter is disabled and light is incident to the pixels on the image pickup surface.

A signal waveform 511 represents a waveform of an input signal on the control line pTX1 of the first transfer transistor 404. A signal waveform 512 represents a waveform of an input signal on the control line pTX2 of the second transfer transistor 411. A signal waveform 513 represents a waveform of an input signal on the control line pOFD of the overflow drain transistor 412. A signal waveform 514 represents a waveform of an input signal on the control line pSEL of the selection transistor 407. A signal waveform 515 represents a waveform of an input signal on the control line pRES of the reset transistor 405.

In addition, a parenthetical numeral or the character m following the respective reference characters pTX1, pTX2, pOFD, pSEL, and pRES represents a line (1st line, 2nd line, . . . , m−1-th line, m-th line) on which a pixel controlling exposure is positioned on the image pickup apparatus 101. In the case of pTX1 and pOFD, a signal is input to all lines (1st line to m-th line) at a same timing.

The phrase "line sequential" as used in the present specification refers to an operation that is performed in an order of the 1st line, the 2nd line, . . . , the m−1-th line, and the m-th line with respect to pixels arranged two-dimensionally on the image pickup apparatus.

In FIG. 5, for all lines, exposure periods of the pixels in each line are collectively started and ended and, at the same time, a plurality of exposures are repetitively performed in one frame.

<Acquisition of First Image Signal>

First, a procedure of acquiring a first image within one frame period will be described.

A control signal input to the control line pMS 510 is switched from the L level to the H level. According to this operation, the blocking of light by the mechanical shutter is disabled and light is incident to the pixels on the image pickup surface.

Prior to collective exposure 500 of all lines, a control signal input to the control line pOFD 513 is simultaneously switched from the L level to the H level for all lines.

Accordingly, residual charges in the photoelectric conversion unit 401 of all pixels in FIG. 4 are discharged to the power supply 409.

Next, with respect to the control line pOFD 513, when the control signal is simultaneously restored to the L level from the H level for all pixels, the image pickup apparatus simultaneously starts the exposure 500 on all pixels.

Next, when a control signal input to the control line pTX1 511 is simultaneously switched from the L level to the H level for all lines, the exposure 500 is simultaneously ended on all pixels, and all of the pixels shown in FIG. 4 simultaneously transfer charges from the photoelectric conversion unit 401 to the charge holding unit 402.

Next, after the simultaneous charge transfer from the photoelectric conversion unit 401 to the charge holding unit 402 by all of the pixels shown in FIG. 4 ends, the control signal of the control line pTX1 511 of all lines is simultaneously restored to the L level from the H level. In this manner, the charge transfer operation from the photoelectric conversion unit 401 to the charge holding unit 402 is realized by an on-off operation of the first transfer transistor 404 or, in other words, control for changing the first transfer transistor 404 from the off-state to the on-state and subsequently from the on-state to the off-state.

Next, in the image pickup apparatus, second and subsequent exposures 501 and 502 and transfer of a charge from the photoelectric conversion unit 401 to the charge holding unit 402 of an arbitrary frame are performed using the driving method described above.

In this manner, in a state where the control signal of the control line pOFD 513 is at the L level or, in other words, in a state where the photoelectric conversion unit 401 accumulates charges, exposure and a charge transfer operation from the photoelectric conversion unit 401 to the charge holding unit 402 are performed a plurality of times within one frame. Accordingly, charges generated in the photoelectric conversion unit 401 during the exposure periods 500, 501, and 502 are added at the charge holding unit 402.

In an arbitrary frame, an end timing of an operation of repetitively exposing all pixels in a collective manner in the image pickup apparatus corresponds to, for example, T50 in FIG. 5.

After a final simultaneous exposure of all pixels, a control signal input to the control line pSEL 514 is line-sequentially switched from the L level to the H level. Next, while maintaining the control signal of the control line pSEL 514 at the H level, a control signal input to the control line pRES 515 is line-sequentially switched from the L level to the H level. According to this operation, residual charges in the input node 403 shown in FIG. 4 are discharged to the power supply 409. Next, while maintaining the control signal of the control line pSEL 514 at the H level, the control signal of the control line pRES 515 is line-sequentially restored to the L level from the H level.

Next, while maintaining the control signal of the control line pSEL 514 at the H level, a control signal input to the control line pTX2 512 is line-sequentially switched from the L level to the H level. As a result, charges generated by repetitive exposures to the photoelectric conversion unit 401 performed within an arbitrary frame are line-sequentially transferred from the charge holding unit 402 to the FD 410. The charges transferred to the FD 410 become an amplified signal (S) which is amplified by operating the amplifier unit 406 through the input node 403.

In the case of an exposure of an n-th frame, the amplified signal (S) is output from the selection transistor 407 to the vertical output line 408 shown in FIG. 4 during a period T52.

The output signal (S) is stored in the first image storage unit 114 of the image storage unit 105 via the signal preprocessing unit 102. After line-sequential charge transfer from the charge holding unit 402 to the FD 410 ends, the control signal of the control line pTX2 512 of all lines is line-sequentially restored to the L level from the H level.

Finally, the control signal of the control line pSEL 514 is line-sequentially restored to the L level from the H level.

This concludes the description of the procedure of performing exposure a plurality of times within one frame period, accumulating a charge generated in a photodiode by each exposure in the charge holding unit by a plurality of on-off operations by the first transfer transistor 404, and transmitting the accumulated charges as a first image to the subsequent-stage first image storage unit 114.

<Acquisition of Second Image Signal>

Next, a procedure of acquiring a second image within one frame period will be described.

In an arbitrary frame, after the end of the period T52 of outputting a pixel signal due to exposure from the vertical output line 408, the control signal input to the control line pOFD 513 is simultaneously switched from the L level to the H level for all lines. Accordingly, residual charges in the photoelectric conversion unit 401 of all pixels in FIG. 4 are discharged to the power supply 409.

Next, while maintaining the control signal of the control line pOFD 513 at the H level, the control signal input to the control line pTX1 511 is simultaneously switched from the L level to the H level and then from the H level to the L level for all lines. At this point, since the OFD transistor 412 is in the on-state, charges derived from exposure at the photoelectric conversion unit 401 are continuously discharged to the power supply 409 and are not transferred to the charge holding unit 402. On the other hand, false signals generated by switching of the control signal to the first transfer transistor 404 by the control line pTX1 511 are added as charges to the charge holding unit 402 through a drain of the first transfer transistor 404.

Next, the driving method of simultaneously inputting the control signal to the control line pTX1 511 from the L level to the H level and then from the H level to the L level for all lines while maintaining the control signal with respect to the control line pOFD 513 at the H level is repetitively performed a plurality of times. The number of repetitions is the same as the number of operations of the first transfer transistor 404 performed during the earlier acquisition of the first image. In addition to making the number of transfer operations by the first transfer transistor 404 the same, execution intervals of the transfer operation (a signal waveform of the control line pTX1 511) may be made the same among the periods 500 to 502 and the periods 503 to 505.

In this manner, in a state where the photoelectric conversion unit 401 of all pixels does not accumulate charges in an arbitrary frame, the first transfer transistor 404 of all pixels operates repetitively in a collective manner. Therefore, only charges due to false signals generated in accordance with the transfer operations of the first transfer transistor 404 are added at the charge holding unit 402. An end timing of the repetitive operations of the first transfer transistor 404 corresponds to, for example, T51 in FIG. 5.

After a final simultaneous repetitive transfer operation of the first transfer transistor 404 of all pixels in a state where the photoelectric conversion unit 401 does not accumulate charges, the control signal input to the control line pSEL 514 is line-sequentially switched from the L level to the H level. Next, while maintaining the control signal of the control line pSEL 514 at the H level, the control signal of the control line pRES 515 is line-sequentially switched from the L level to the H level. According to this operation, residual charges in the input node 403 shown in FIG. 4 are discharged to the power supply 409. Next, while maintaining the control signal of the control line pSEL 514 at the H level, the control signal of the control line pRES 515 is line-sequentially restored to the H level from the L level.

Next, while maintaining the control signal of the control line pSEL 514 at the H level, the control signal of the control line pTX2 512 is line-sequentially switched from the L level to the H level. As a result, false signals generated by the collective repetitive operations of the first transfer transistor 404 of all pixels are line-sequentially transferred from the charge holding unit 402 to the FD 410. The charges transferred to the FD 410 become an amplified signal (N) which is amplified by operating the amplifier unit 406 through the input node 403.

In the case of an exposure of the n-th frame, the amplified signal (N) is output from the selection transistor 407 to the vertical output line 408 shown in FIG. 4 during a period T53. The output signal (N) is stored in the second image storage unit 115 of the image storage unit 105 via the signal preprocessing unit 102. After line-sequential charge transfer from the charge holding unit 402 to the FD 410 ends, the control signal of the control line pTX2 512 of all lines is line-sequentially restored to the L level from the H level.

Finally, the control signal of the control line pSEL 514 is line-sequentially restored to the L level from the H level.

This concludes the description of the procedure of accumulating false signals generated by collective repetitive on-off operations of the first transfer transistor 404 of all pixels in a state where the photoelectric conversion unit of all pixels does not accumulate charges within one frame period, and transmitting the accumulated false signals as a second image to the subsequent-stage second image storage unit.

<Processing Flow of Image Processing Unit>

Figure 6:
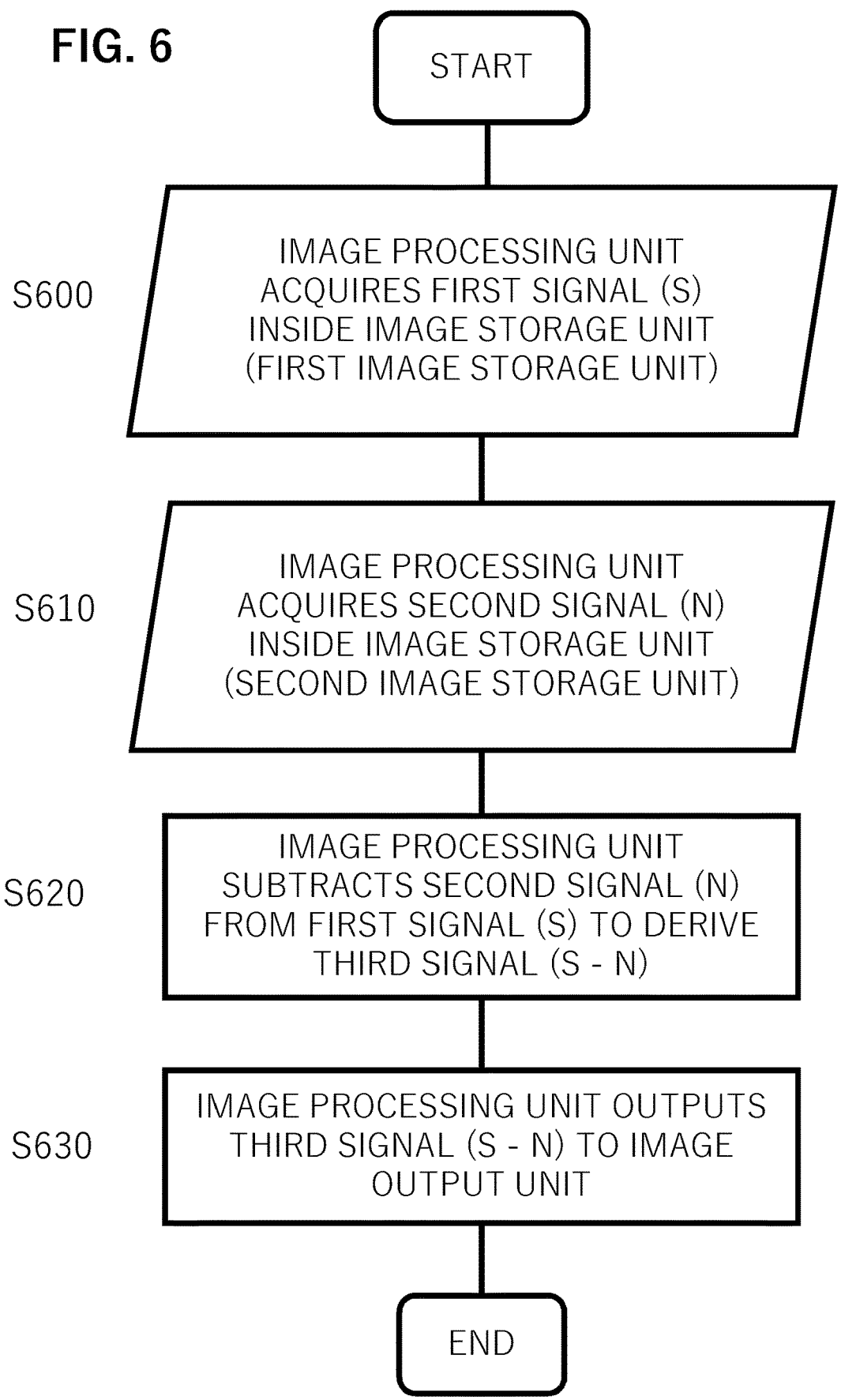
FIG. 6 shows an image processing flow according to the first embodiment.

FIG. 6 is a diagram showing steps of signal processing performed by the image processing unit 106. After acquiring and processing the signal (S) and the signal (N) stored inside the image storage unit 105, the image processing unit 106 transmits results thereof to the image output unit 107.

Images of the signal (S) and the signal (N) stored in the first and second image storage units (114 and 115) inside the image storage unit 105 are read from the image processing unit 106 in steps S600 and S610. As the first and second image storage units (114 and 115), a so-called frame memory that stores image signals per frame or a so-called line memory that stores image signals per line can be applied.

In step S620, the image processing unit 106 performs a difference calculation of images of the read signal (S) and the read signal (N), and derives an image of a signal (S−N). The signal (S), the signal (N), and the signal (S−N) respectively correspond to the first signal, the second signal, and the third signal according to the present invention. In addition, the image processing unit 106 corresponds to the calculating unit according to the present invention.

Finally, in step S630, the image processing unit 106 sends the image of the signal (S−N) from which false signals created by repetitive operations of the first transfer transistor 404 have been removed to the image output unit 107.

In this manner, the present embodiment solves a problem of contamination of a signal of an exposure image by false signals generated in accordance with repetitive operations of a transfer transistor when acquiring an image by performing intermittent exposure a plurality of times within one arbitrary frame period. Specifically, by separately acquiring false signals created by repetitively operating a transfer transistor in a state where the photoelectric conversion unit 401 does not accumulate charges and calculating a difference between a signal of an exposure image including the false signals and the false signals, a high-quality exposure image from which false signal components have been removed can be acquired.

Regarding the signal (N) and the signal (S) used in the calculation, the signal (N) may be acquired before acquiring the signal (S) within a same frame. Alternatively, the signal (N) acquired in an n−1-th frame and the signal (S) acquired in the n-th frame may be used.

In addition, frames for acquiring the signal (N) may be intermittently provided, and a difference calculation between the signal (S) and the signal (N) may be performed using the intermittently-acquired signal (N) with respect to frames in which the signal (N) was not acquired.

Furthermore, the number of transfer operations of the first transfer transistor 404 during an exposure period and the number of transfer operations of the first transfer transistor 404 during a non-exposure period need not necessarily be the same number and the number of transfer operations during a non-exposure period may be larger or smaller. In this case, the image processing unit 106 need only subtract, from the signal (S), a signal obtained by multiplying the signal (N) by a gain in accordance with a ratio of the numbers of transfer operations during an exposure period and a non-exposure period. By reducing the number of transfer operations in a non-exposure period, the number of intermittent exposures per frame can be increased.

In addition, since the present embodiment adopts a driving method (global shutter) in which operations for starting and stopping exposure are collectively performed by all image pickup regions of the image pickup apparatus, an image without so-called dynamic body distortion can be acquired.

Second Embodiment

The present embodiment also controls an exposure period using an electronic shutter, and block diagrams of the image pickup system (FIGS. 1 and 2) and the image pickup apparatus (FIG. 3), the equivalent circuit diagram (FIG. 4), and steps of image processing (FIG. 6) are configured in the same manner as in the first embodiment. While all pixels collectively perform exposure at the same timing in the first embodiment, in the present embodiment, scan control of an exposure period is performed in a line-sequential manner. Hereinafter, the present embodiment will be described with reference to FIGS. 1 to 4, 6, and 7.

<Timing Chart>

Figure 7:
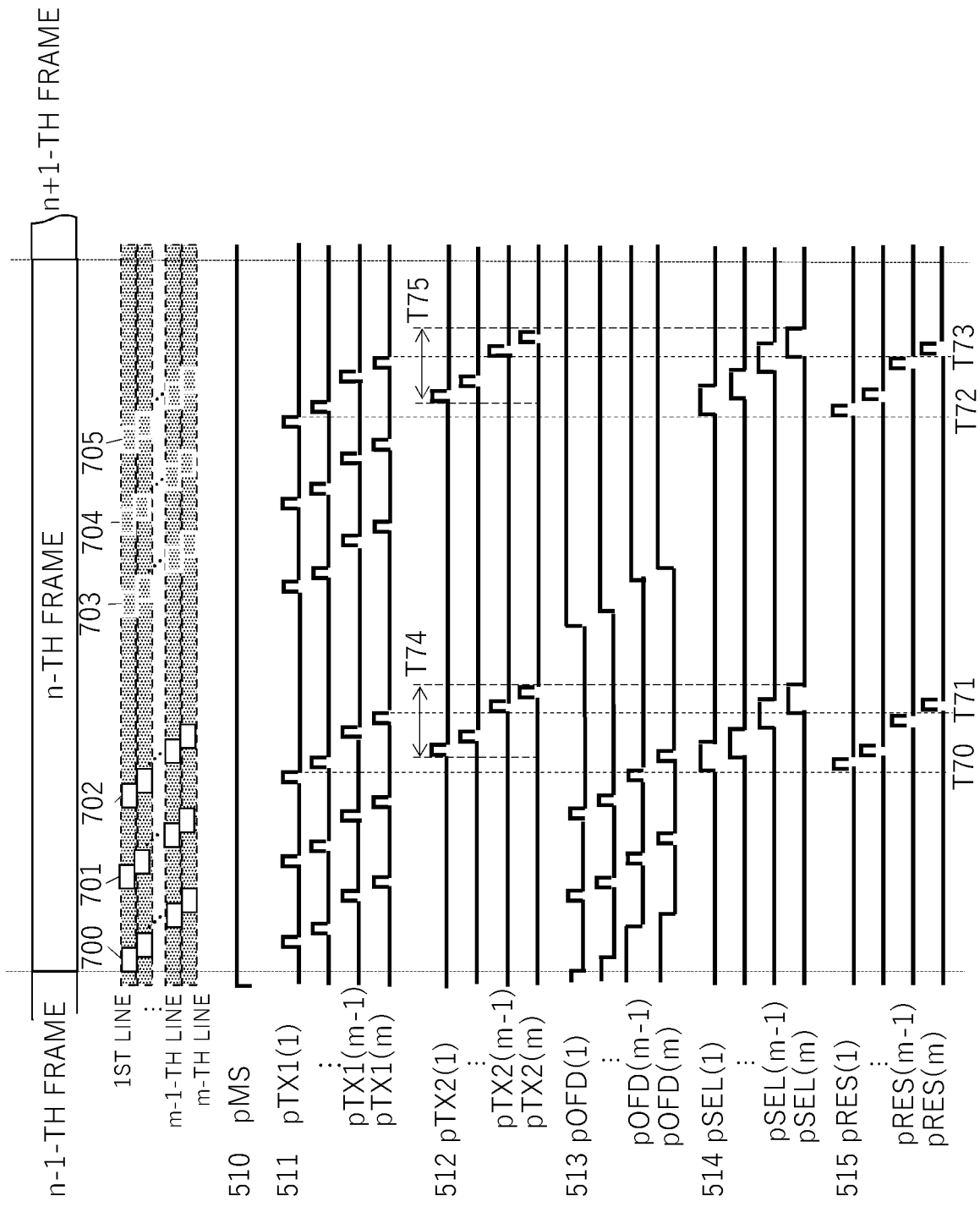
FIG. 7 is a timing chart of drive of an image pickup system according to a second embodiment.

FIG. 7 is a timing chart for explaining operations of the image pickup system 100 according to the present embodiment.

Outlined rectangles 700, 701, and 702 represent exposure periods, and other periods are non-exposure periods. Outlined rectangles 703, 704, and 705 represent periods in which false signal reading in a non-exposure state is performed and which correspond to the exposure periods 700, 701, and 702.

A parenthetical numeral or the character m following the respective reference characters of the signal waveforms 510, 511, 512, 513, 514, and 515 as well as pMS, pTX1, pTX2, pOFD, pSEL, and pRES have the same meanings as the reference characters in FIG. 5 according to the first embodiment.

In FIG. 7, pixels in each line line-sequentially start and end exposure periods and, at the same time, a plurality of exposures are repetitively performed in one frame.

<Acquisition of First Image Signal>

First, a procedure of acquiring a first image within one frame period will be described.

The control signal of the control line pMS 510 is switched from the L level to the H level. Due to this operation, the blocking of light by the mechanical shutter is disabled and light is incident to the pixels on the image pickup surface.

Prior to an exposure 700, the control signal of the control line pOFD 513 is switched from the L level to the H level. Accordingly, residual charges in the photoelectric conversion unit 401 are discharged to the power supply 409.

Next, with respect to the control line pOFD 513, when the control signal is line-sequentially restored to the L level from the H level, the image pickup apparatus starts the exposure 700.

Next, when the control signal of the control line pTX1 511 is switched from the L level to the H level, the exposure 700 is ended and charges are line-sequentially transferred from the photoelectric conversion unit 401 to the charge holding unit 402.

Next, after the line-sequential charge transfer from the photoelectric conversion unit 401 to the charge holding unit 402 of the pixels shown in FIG. 4 ends, the control signal of the control line pTX1 511 is line-sequentially restored to the L level from the H level. According to this operation, charges generated during the exposure periods in the photoelectric conversion unit 401 are transferred to the charge holding unit 402.

Next, in the image pickup apparatus 101, second and subsequent exposures 701 and 702 and transfer of a charge from the photoelectric conversion unit 401 to the charge holding unit 402 of an arbitrary frame are performed using the driving method described above.

In this manner, due to exposures that are repetitively performed in an arbitrary frame, the charges generated in the photoelectric conversion unit 401 during the exposure periods are added at the charge holding unit 402.

In an arbitrary frame, an end timing of an operation of repetitive line-sequential exposure in the image pickup apparatus corresponds to, for example, T70 in FIG. 7 in the case of a first line and T71 in FIG. 7 in the case of an m-th line.

Next, the control signal of the control line pSEL 514 of the image pickup apparatus is line-sequentially switched from the L level to the H level. In addition, while maintaining the control signal of the control line pSEL 514 at the H level, the control signal of the control line pRES 515 is line-sequentially switched from the L level to the H level. According to this operation, residual charges in the input node 403 of the amplifier unit 406 are discharged to the power supply 409.

Next, while maintaining the control signal of the control line pSEL 514 at the H level, the control signal of the control line pRES 515 is line-sequentially restored to the L level from the H level.

Next, while maintaining the control signal of the control line pSEL 514 at the H level, the control signal of the control line pTX2 512 of the image pickup apparatus is line-sequentially switched from the L level to the H level. As a result, charges generated by repetitive exposures to the photoelectric conversion unit 401 performed within an arbitrary frame are transferred from the charge holding unit 402 to the FD 410. The charges transferred to the FD 410 become an amplified signal (S) which is amplified by operating the amplifier unit 406 through the input node 403. The amplified signal (S) is output from the vertical output line 408 and stored in the first image storage unit 114 of the image storage unit 105 via the signal preprocessing unit 102.

Next, the control signal of the control line pSEL 514 in the image pickup apparatus 101 is switched from the L level to the H level. Accordingly, an amplified pixel signal is output from the selection transistor 407 to the vertical output line 408. After charge transfer from the charge holding unit 402 to the FD 410 ends, the control signal of the control line pTX2 512 is line-sequentially restored to the L level from the H level.

Finally, the control signal of the control line pSEL 514 is line-sequentially restored to the L level from the H level.

This concludes the description of the procedure of acquiring and transmitting a first image signal according to the present embodiment. As described above, in a state where the photoelectric conversion unit 401 is accumulating charges, a plurality of exposures are performed in a line-sequential manner in one frame period, and a charge generated in the photoelectric conversion unit 401 by each exposure is accumulated in the charge holding unit 402 by a plurality of line-sequential operations by the first transfer transistor 404. In addition, the charge of the charge holding unit 402 is transferred to the FD 410 and transmitted to the first image storage unit 114.

<Acquisition of Second Image Signal>

Next, a procedure of acquiring a second image within one frame period will be described.

In an arbitrary frame, after the end of the period T74 of outputting a pixel signal due to exposure from the vertical output line 408, the control signal of the control line pOFD 513 is line-sequentially switched from the L level to the H level. Accordingly, residual charges in the photoelectric conversion unit 401 of the pixels in FIG. 4 are discharged to the power supply 409.

Next, while maintaining the control signal with respect to the control line pOFD 513 at the H level, the control signal of the control line pTX1 511 is line-sequentially switched from the L level to the H level and then from the H level to the L level. At this point, since the OFD transistor 412 is in the on-state, charges derived from exposure at the photoelectric conversion unit 401 are continuously discharged to the power supply 409 and are not transferred to the charge holding unit 402. On the other hand, false signals generated by switching of the control signal to the first transfer transistor 404 by the control line pTX1 511 are added as charges to the charge holding unit 402 through a drain of the first transfer transistor 404.

The driving method of line-sequentially switching the control signal of the control line pTX1 511 from the L level to the H level and then from the H level to the L level while maintaining the control signal with respect to the control line pOFD 513 at the H level is repetitively performed a plurality of times. The number of repetitions is the same as the number of operations of the first transfer transistor 404 performed during the earlier acquisition of the first image. In addition to making the number of transfer operations by the first transfer transistor 404 the same, execution intervals of the transfer operation (a signal waveform of the control line pTX1 511) may be made the same among the periods 700 to 702 and the periods 703 to 705.

In this manner, in a state where the photoelectric conversion unit 401 of all pixels does not accumulate charges in an arbitrary frame, the first transfer transistor 404 of all pixels operates repetitively in a line-sequential manner. Therefore, only charges due to false signals generated in accordance with the transfer operations of the first transfer transistor 404 are added at the charge holding unit 402. An end timing of the repetitive operations of the first transfer transistor 404 corresponds to, for example, T72 in FIG. 7 in the case of the first line and T73 in FIG. 7 in the case of the m-th line.

After a final line-sequential repetitive operation of the first transfer transistor 404 in a state where the photoelectric conversion unit 401 of all pixels does not accumulate charges, the control signal of the control line pSEL 514 is line-sequentially switched from the L level to the H level. Next, while maintaining the control signal of the control line pSEL 514 at the H level, the control signal of the control line pRES 515 is line-sequentially switched from the L level to the H level. According to this operation, residual charges in the input node 403 shown in FIG. 4 are discharged to the power supply 409. Next, while maintaining the control signal of the control line pSEL 514 at the H level, the control signal of the control line pRES 515 is line-sequentially restored to the L level from the H level.

Next, while maintaining the control signal of the control line pSEL 514 at the H level, the control signal of the control line pTX2 512 is line-sequentially switched from the L level to the H level. As a result, false signals generated by the line-sequential repetitive operations of the first transfer transistor 404 of all pixels in a state where the photoelectric conversion unit 401 of all pixels does not accumulate charges in an arbitrary frame are line-sequentially transferred from the charge holding unit 402 to the FD 410. The charges transferred to the FD 410 become an amplified signal (N) which is amplified by operating the amplifier unit 406 through the input node 403.

In the case of an exposure of the n-th frame, the amplified signal (N) is output from the selection transistor 407 to the vertical output line 408 shown in FIG. 4 during a period T75. The output signal (N) is stored in the second image storage unit 115 of the image storage unit 105 via the signal preprocessing unit 102. After line-sequential charge transfer from the charge holding unit 402 to the FD 410 ends, the control signal of the control line pTX2 512 is line-sequentially restored to the L level from the H level. Finally, the control signal of the control line pSEL 514 is line-sequentially restored to the L level from the H level.

This concludes the description of the procedure of acquiring and transmitting a second image signal according to the present embodiment. As described above, false signals generated by line-sequential repetitive operations of the first transfer transistor 404 of all pixels in a state where the photoelectric conversion unit 401 does not accumulate charges are accumulated in the charge holding unit and the accumulated false signals are transmitted as a second image to the subsequent-stage second image storage unit 115.

<Processing Flow of Image Processing Unit>

Configurations and processing steps of the image storage unit 105, the first and second image storage units (114 and 115), the image processing unit 106, and the image output unit 107 with respect to the signals (S) and (N) transmitted from the signal preprocessing unit 102 follow the descriptions of the first embodiment and FIG. 6.

As described above, in a similar manner to the first embodiment, the present embodiment performs a plurality of intermittent exposures and non-exposures within one arbitrary frame, respectively acquires an exposure image including false signals and a non-exposure image made up of false signals, and calculates a difference between the images. Accordingly, a high-quality exposure image from which false signal components have been removed can be acquired.

Regarding the signal (N) and the signal (S) used in the calculation, the signal (N) may be acquired before acquiring the signal (S) within a same frame. Alternatively, the signal (N) acquired in the n−1-th frame and the signal (S) acquired in the n-th frame may be used.

In addition, frames for acquiring the signal (N) may be intermittently provided, and a difference calculation between the signal (S) and the signal (N) may be performed using the intermittently-acquired signal (N) with respect to frames in which the signal (N) was not acquired.

Furthermore, in the present embodiment, since the image pickup apparatus line-sequentially picks up images, operations of the transfer transistor are more time-dispersed than in the first embodiment and, consequently, restrictions on designing a circuit for suppressing a supply voltage variation due to operations of the transfer transistor are eased.

Third Embodiment

The present embodiment is an image pickup system which performs drive using both an image pickup apparatus and a mechanical shutter. While charge accumulation to the photoelectric conversion unit is controlled using an OFD transistor in the first and second embodiments, in the present embodiment, charge accumulation to the photoelectric conversion unit is controlled by opening and closing the mechanical shutter. The block diagrams of the image pickup system (FIGS. 1 and 2) and the image pickup apparatus and the signal preprocessing unit (FIG. 3), and the steps of image processing (FIG. 6) share the same configurations as the first and second embodiments. Hereinafter, the present embodiment will be described with reference to FIGS. 1 to 3, 6, 8, and 9.

<Equivalent Circuit Diagram of Pixel Unit>

Figure 8:
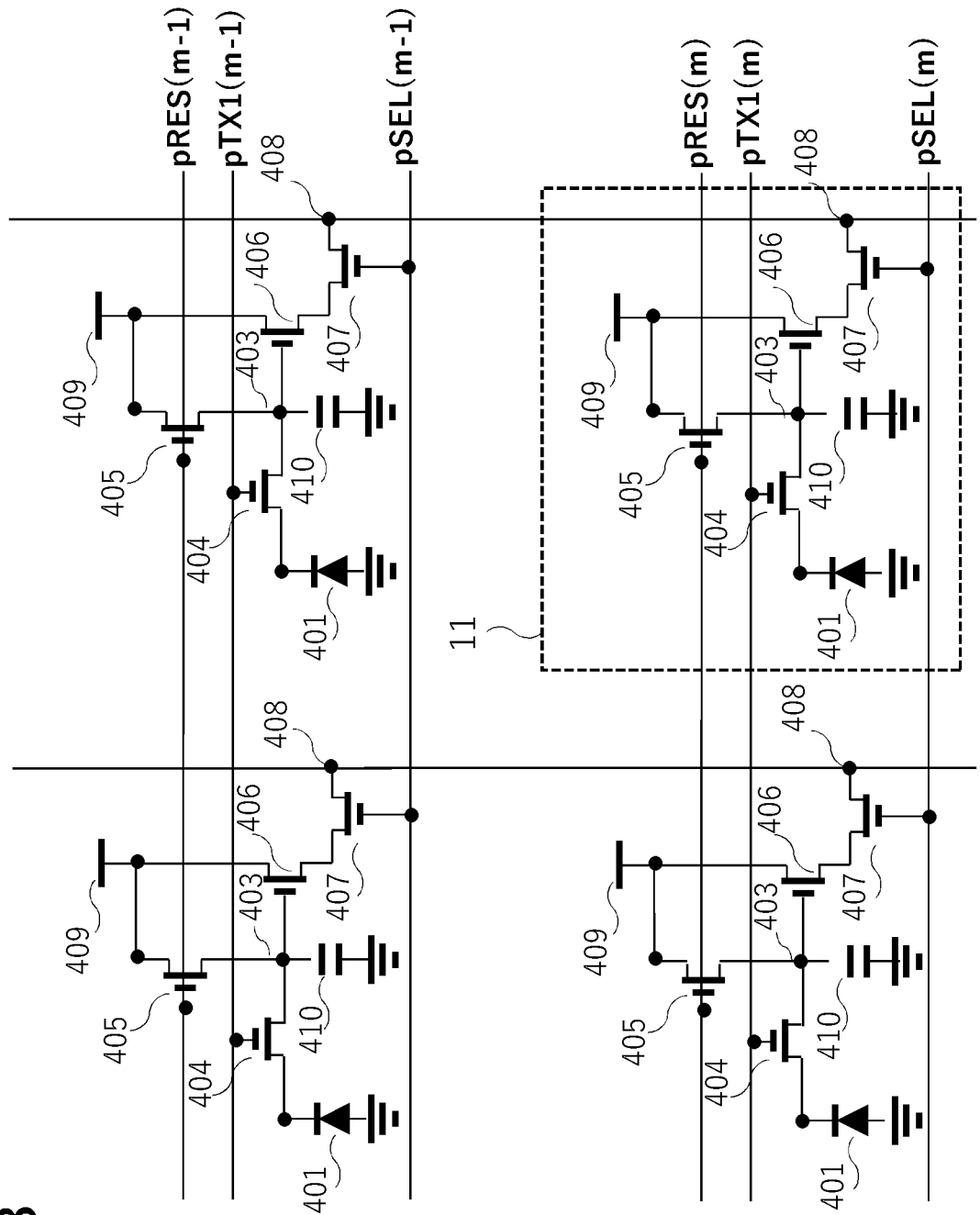
FIG. 8 is an equivalent circuit diagram of a pixel unit according to a third embodiment.

FIG. 8 shows a configuration of an equivalent circuit of the pixel 11 shown in FIG. 3 according to the present embodiment. FIG. 8 represents an example constituted by four pixels. The reference characters arranged in the pixel 11 in FIG. 8 have the same names and functions as the configuration (FIG. 4) of the equivalent circuit described in the first and second embodiments. Compared to the configuration (FIG. 4) of the equivalent circuit described in the first and second embodiments, in the equivalent circuit shown in FIG. 8, the charge holding unit 402, the second transfer transistor 411, the overflow drain transistor 412, and the control lines pTX2 and pOFD have been omitted. In addition, the photoelectric conversion unit 401 is connected to the FD 410 via the first transfer transistor 404. In addition to the function as an input node of the amplifier unit 406, the FD 410 serves the function of the charge holding unit 402 in the first and second embodiment or, in other words, the function of receiving and holding, via operations of the first transfer transistor 404, a charge generated by the photoelectric conversion unit 401 due to exposure. In the present embodiment, the FD 410 corresponds to the charge accumulation unit and the first transfer transistor 404 corresponds to a transfer transistor that performs a charge transfer operation from the photoelectric conversion unit to the charge accumulation unit.

<Timing Chart>

FIG. 9 is a timing chart for explaining operations of the image pickup system according to the present embodiment. Outlined rectangles 900, 901, and 902 represent exposure periods, and other periods are non-exposure periods. Outlined rectangles 903, 904, and 905 indicate periods in which false signal reading in a non-exposure state is performed and which correspond to the exposure periods 900, 901, and 902.

A signal waveform 910 represents a waveform of a signal pMS input to the wiring 170 which connects the control signal output unit 130 with the mechanical shutter 112 in FIG. 2. When the signal pMS is input from the L level to the H level, the front curtain of the mechanical shutter starts to line-sequentially travel on an image pickup surface of the image pickup apparatus on which pixels are arranged. In addition, when the signal pMS is input from the H level to the L level, the rear curtain of the mechanical shutter starts to line-sequentially travel on the image pickup surface of the image pickup apparatus on which pixels are arranged. Therefore, during a period after the front curtain of the mechanical shutter travels on the image pickup surface and departs therefrom and before the rear curtain arrives on the image pickup surface, the pixels on the image pickup surface are in an exposure state.

A signal waveform 911 represents a waveform of an input signal on the control line pTX1 of the first transfer transistor 404 shown in FIG. 8. A signal waveform 914 represents a waveform of an input signal on the control line pSEL of the selection transistor 407 shown in FIG. 8. A signal waveform 915 represents a waveform of an input signal on the control line pRES of the reset transistor 405 shown in FIG. 8.

<Acquisition of First Image Signal>

First, a procedure of acquiring a first image within one frame period will be described.

Prior to an exposure 900, the control signals of the control lines pSEL 814 and pRES 815 are switched from the L level to the H level. According to this operation, residual charges in the input node 403 and the FD 410 are discharged to the power supply 409. After discharging the residual charges in the input node 403 and the FD 410, the control signals of the control lines pSEL 814 and pRES 815 are restored to the L level from the H level.

Next, an input signal pMS 910 of the wiring 170 in FIG. 2 is input from the L level to the H level and the front curtain of the mechanical shutter is caused to travel in a line-sequential manner and, subsequently, the input signal pMS 910 is input from the H level to the L level and the rear curtain of the mechanical shutter is caused to travel in a line-sequential manner. A period after the front curtain of the mechanical shutter travels on the image pickup surface and departs therefrom and before the rear curtain arrives on the image pickup surface is the exposure period 900.

Next, after the end of the exposure period 900, when the control line pTX1 911 is line-sequentially input from the L level to the H level, charges generated in the exposure period 900 in the photoelectric conversion unit 401 are transferred to the FD 410 via the first transfer transistor 404.

Next, after the line-sequential charge transfer from the photoelectric conversion unit 401 to the FD 410 of the pixels shown in FIG. 8 ends, the control signal of the control line pTX1 911 is line-sequentially restored to the L level from the H level. In this manner, a charge transfer operation from the photoelectric conversion unit 401 to the FD 410 is realized by an on-off operation of the first transfer transistor 404 or, in other words, control for changing the first transfer transistor 404 from the off-state to the on-state and subsequently from the on-state to the off-state.

Next, the input signal pMS 910 of the wiring 170 in FIG. 2 is operated from the L level to the H level and subsequently from the H level to the L level, and second and subsequent operations of the mechanical shutter and the exposures 901 and 902 in an arbitrary frame are performed.

Furthermore, the control line pTX1 911 is line-sequentially input from the L level to the H level after the end of each of the exposures 901 and 902, and charges generated during the exposure periods 901 and 902 in the photoelectric conversion unit 401 are transferred to the FD 410 via the first transfer transistor 404.

In this manner, due to exposures that are repetitively performed in an arbitrary frame, the charges generated in the photoelectric conversion unit 401 during each exposure period are added at the FD 410. In an arbitrary frame, an end timing of an operation of repetitive line-sequential exposure in the image pickup apparatus corresponds to, for example, T90 in FIG. 9 in the case of the first line and T91 in FIG. 9 in the case of the m-th line.

After a last operation of repetitive line-sequential exposure by the image pickup apparatus, the control line pSEL 914 is input from the L level to the H level so as to coincide with the input from the L level to the H level on the control line pTX1 911. As a result, the charges transferred to and accumulated in the FD 410 become an amplified signal (S) which is amplified by operating the amplifier unit 406 through the input node 403. In addition, the amplified signal (S) is output from the selection transistor 407 to the vertical output line 408.

Finally, the inputs of the control lines pTX1 911 and pSEL 914 are line-sequentially restored to the L level from the H level.

This concludes the description of the procedure of acquiring and transmitting a first image signal according to the present embodiment. As described above, a plurality of exposures are performed in a line-sequential manner in one frame period using the mechanical shutter in combination, and a charge generated in the photoelectric conversion unit 401 by each exposure is accumulated in the FD 410 by a plurality of line-sequential operations by the first transfer transistor 404. In addition, the signal (S) is transmitted as a first image to the subsequent-stage first image storage unit 114.

<Acquisition of Second Image Signal>

Next, a procedure of acquiring a second image within one frame period will be described.

In an arbitrary frame, after the end of the period T94 of outputting an image signal due to exposure from the vertical output line 408, control signals of the control lines pSEL 914 and pRES 915 are switched from the L level to the H level. According to this operation, residual charges in the input node 403 and the FD 410 shown in FIG. 8 are discharged to the power supply 409. After discharging the residual charges in the input node 403 and the FD 410, the control signals of the control lines pSEL 914 and pRES 915 are restored to the L level from the H level.

Next, the input signal pMS 810 of the wiring 170 in FIG. 2 is maintained at the L level throughout an acquisition period of the second image signal. According to this operation, the photoelectric conversion unit 401 does not generate a charge throughout the acquisition period of the second image signal and charges are not accumulated in the photoelectric conversion unit 401.

After the end of the non-exposure period 903, the control line pTX1 911 is line-sequentially input from the L level to the H level and then line-sequentially input from the H level to the L level. At this point, the photoelectric conversion unit 401 has not generated a charge and transfer of a charge from the photoelectric conversion unit 401 to the FD 410 does not take place. On the other hand, false signals generated by input of the control signal to the first transfer transistor 404 by the control line pTX1 911 are added as charges to the FD 410 through a drain of the first transfer transistor 404.

The driving method of line-sequentially switching the control signal of the control line pTX1 911 from the L level to the H level and then from the H level to the L level in a state where the mechanical shutter is closed is repetitively performed a plurality of times. Specifically, in the non-exposure periods 903, 904, and 905 which correspond to the exposure periods 900, 901, and 902, the driving method is repetitively performed a same number of times as the operation of the first transfer transistor 404 performed when acquiring the first image. In addition to the number of executions, execution intervals of the transfer operation (in other words, a signal waveform 911 of the control line pTX1) may also be set the same as in the exposure periods 900, 901, and 902.

In this manner, charges due to false signals generated by the line-sequential repetitive operations of the first transfer transistor 404 of all pixels in a state where the photoelectric conversion unit 401 of all pixels does not accumulate charges in an arbitrary frame are added at the FD 410. An end timing of the repetitive operations of the first transfer transistor 404 corresponds to, for example, T92 in FIG. 9 in the case of the first line and T93 in FIG. 9 in the case of the m-th line.

After a last line-sequential repetitive operation by the first transfer transistor 404 in the non-exposure state, the control line pSEL 914 is input from the L level to the H level so as to coincide with the input from the L level to the H level on the control line pTX1 911. As a result, the charges transferred to and accumulated in the FD 410 become an amplified signal (N) which is amplified by operating the amplifier unit 406 through the input node 403. In addition, the amplified signal (N) is output from the selection transistor 407 to the vertical output line 408.

Finally, the inputs of the control lines pTX1 911 and pSEL 914 are line-sequentially restored to the L level from the H level.

This concludes the description of the procedure of acquiring and transmitting a second image signal according to the present embodiment. As described above, the mechanical shutter is shut and incidence of light to the photoelectric conversion unit 401 is blocked so as to prevent charges from being accumulated in the photoelectric conversion unit 401. In this state, false signals generated by the plurality of line-sequential operations by the first transfer transistor 404 within one frame period are accumulated in the FD 410 and the signal (N) is transmitted as a second image to the subsequent-stage second image storage unit.

<Processing Flow of Image Processing Unit>

Configurations and processing steps of the image storage unit 105, the first and second image storage units (114 and 115), the image processing unit 106, and the image output unit 107 with respect to the signal (S) and the signal (N) transmitted from the signal preprocessing unit 102 follow the descriptions of the first and second embodiments and FIG. 6.

As described above, in a similar manner to the first and second embodiments, the present embodiment performs a plurality of intermittent exposures and non-exposures within one arbitrary frame, respectively acquires an exposure image including false signals and a non-exposure image made up of false signals, and calculates a difference between the images. Accordingly, a high-quality exposure image from which false signal components have been removed can be acquired.

In addition, the present embodiment can be applied to image pickup apparatuses with a simpler equivalent circuit configuration as compared to the first and second embodiments.

Fourth Embodiment

Figure 10A:
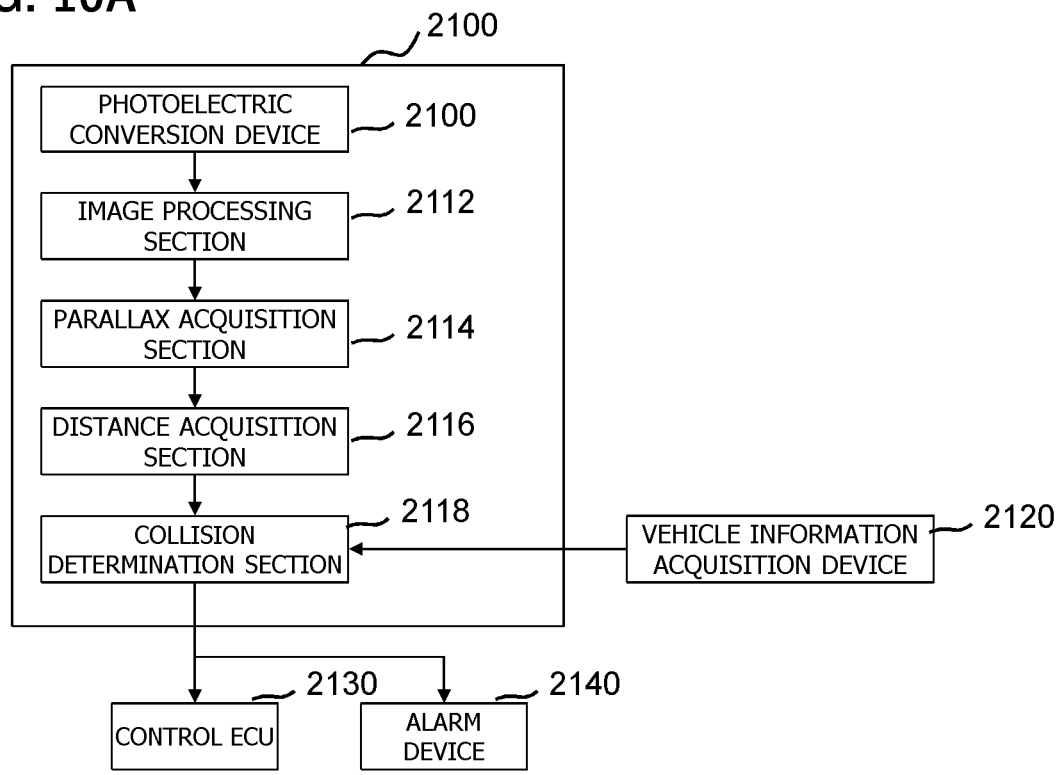
FIGS. 10A and 10B are diagrams showing a configuration example of an image pickup system and a moving body according to a fourth embodiment.
Figure 10B:
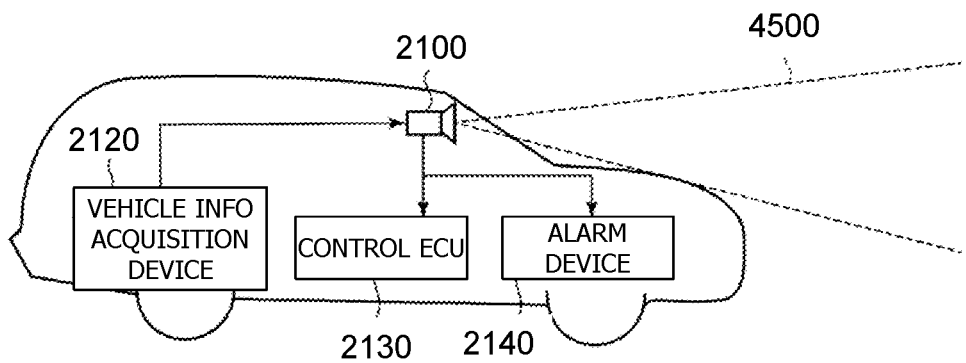

An image pickup system and a moving body according to a fourth embodiment of the present invention will be described with reference to FIGS. 10A and 10B. FIGS. 10A and 10B are diagrams showing configurations of the image pickup system and the moving body according to the present embodiment.

FIG. 10A shows an example of an image pickup system 2100 related to a vehicle-mounted camera. The image pickup system 2100 has an image pickup apparatus 2110. The image pickup apparatus 2110 is any of the image pickup apparatuses described in the first to third embodiments. The image pickup system 2100 has a parallax acquiring unit 2114. The image pickup system 2100 has an image processing unit 2112 which is a processing apparatus that performs image processing on a plurality of pieces of image data acquired by the image pickup apparatus 2110. The parallax acquiring unit 2114 calculates a parallax (a phase difference of a parallax image) from the plurality of pieces of image data acquired by the image pickup apparatus 2110. In addition, the image pickup system 2100 has a distance acquiring unit 2116 which is a processing apparatus that calculates a distance to an object based on the calculated parallax and a collision determining unit 2118 which is a processing apparatus that determines whether or not there is a possibility of a collision based on the calculated distance. In this case, the parallax acquiring unit 2114 and the distance acquiring unit 2116 are examples of information acquiring means which acquires information such as information related to a distance to the object. In other words, distance information is information related to a parallax, a defocus amount, a distance to the object, or the like. The collision determining unit 2118 may determine a possibility of a collision using any of these pieces of distance information. The processing apparatuses described above may be realized by exclusively-designed hardware or may be realized by general-purpose hardware which performs calculations based on a software module. In addition, the processing apparatuses may be realized by an FPGA (Field Programmable Gate Array), an ASIC (Application Specific Integrated Circuit), or the like or by a combination thereof.

The image pickup system 2100 is connected to a vehicle information acquiring apparatus 2120 and is capable of acquiring vehicle information such as a vehicle speed, a yaw rate, and a steering angle. In addition, a control ECU 2130 which is a control apparatus that outputs a control signal causing a vehicle to generate a braking force based on a determination result of the collision determining unit 2118 is connected to the image pickup system 2100. In other words, the control ECU 2130 is an example of moving body control means which controls a moving body based on distance information. Furthermore, the image pickup system 2100 is also connected to a warning apparatus 2140 which issues a warning to a driver based on a determination result of the collision determining unit 2118. For example, when it is found that the possibility of a collision is high as a determination result of the collision determining unit 2118, the control ECU 2130 performs vehicle control involving applying the brakes, releasing the gas pedal, suppressing engine output, or the like to avoid a collision and/or reduce damage. The warning apparatus 2140 issues a warning to a user by sounding an alarm, displaying warning information on a screen of a car navigation system or the like, vibrating a seat belt or a steering wheel, or the like.

In the present embodiment, an image of a periphery of the vehicle such as the front or the rear of the vehicle is picked up by the image pickup system 2100. FIG. 10B shows the image pickup system 2100 when an image of the front of the vehicle (an image pickup range 2150) is picked up. The vehicle information acquiring apparatus 2120 sends an instruction to operate the image pickup system 2100 and have the image pickup system 2100 perform image pickup. Using the image pickup apparatus according to the first to third embodiments described above as the image pickup apparatus 2110 enables the image pickup system 2100 according to the present embodiment to improve accuracy of ranging.

While an example of controlling a vehicle so as to prevent a collision with another vehicle has been described above, the image pickup system can also be applied to controlling automated driving so that the vehicle follows another vehicle, controlling automated driving so that the vehicle stays within a lane, and the like. In addition, the image pickup system is not limited to a vehicle such as an automobile and can also be applied to a moving body (a transportation machine) such as a ship, an airplane, or an industrial robot. A moving apparatus in a moving body (a transportation machine) refers to various driving sources such as an engine, a motor, a wheel, and a propeller. Furthermore, besides moving bodies, the photoelectric conversion apparatus can be applied to a wide variety of devices that utilize object recognition such as an intelligent transportation system (ITS).

Other Embodiments

Embodiment(s) of the present invention can also be realized by a computer of a system or apparatus that reads out and executes computer executable instructions (e.g., one or more programs) recorded on a storage medium (which may also be referred to more fully as 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-231926, filed on Dec. 11, 2018, which is hereby incorporated by reference herein in its entirety.

What is claimed is:

1. A photoelectric conversion apparatus, comprising:
a photoelectric conversion unit;
a charge accumulation unit configured to accumulate charges generated in the photoelectric conversion unit;
a transfer transistor configured to connect the photoelectric conversion unit and the charge accumulation unit to each other and to perform a transfer operation of a charge from the photoelectric conversion unit to the charge accumulation unit; and
a control unit configured (1) to perform an on-off operation of the transfer transistor a plurality of times in a state where the charge accumulation unit is accumulating charges to obtain a first signal, (2) to perform an on-off operation of the transfer transistor a plurality of times in a state where the charge accumulation unit is not accumulating charges to obtain a second signal, and (3) to output the first signal and the second signal.

2. The photoelectric conversion apparatus according to claim 1, wherein the number of times the on-off operation of the transfer transistor is performed in order to obtain the first signal and the number of times the on-off operation of the transfer transistor is performed in order to obtain the second signal are the same.

3. The photoelectric conversion apparatus according to claim 1, further comprising an overflow drain transistor configured to connect the photoelectric conversion unit and a power supply to each other,
wherein an accumulation state of charges of the photoelectric conversion unit is controlled by switching between an on-state and an off-state of the overflow drain transistor.

4. The photoelectric conversion apparatus according to claim 1, further comprising a shutter configured to block incidence of light to the photoelectric conversion unit,
wherein an accumulation state of charges to the photoelectric conversion unit is controlled by opening and closing the shutter.

5. The photoelectric conversion apparatus according to claim 1, wherein a plurality of pixel units each including the photoelectric conversion unit, the charge accumulation unit, and the transfer transistor are two-dimensionally arranged.

6. The photoelectric conversion apparatus according to claim 1, wherein the photoelectric conversion units of the plurality of pixel units simultaneously start and end exposure.

7. The photoelectric conversion apparatus according to claim 1, wherein the photoelectric conversion units of the plurality of pixel units line-sequentially start and end exposure.

8. An image pickup system, comprising:
the photoelectric conversion apparatus according to claim 1;
an optical system configured to form an optical image on the photoelectric conversion apparatus; and
a calculating unit configured to acquire a third signal being a difference between the first signal and the second signal obtained from the photoelectric conversion apparatus.

9. A moving body, comprising:
the image pickup system according to claim 8;
a moving apparatus; and
a control apparatus which controls the moving apparatus on the basis of the third signal output from the calculating unit of the image pickup system.

10. The photoelectric conversion apparatus according to claim 1, further comprising:
a diffusion floating capacity configured to receive and hold the charges transferred from the charge accumulation unit;
a second transfer transistor configured to connect the charge accumulation unit and the diffusion floating capacity to each other and to perform a second transfer operation of a charge from the charge accumulation unit to the diffusion floating capacity; and
an overflow drain transistor configured to connect the photoelectric conversion unit and a power supply to each other,
wherein a state where the charge accumulation unit is accumulating charges is a state where the overflow drain transistor is on-state, and
wherein the control unit is configured to perform the on-off operation of the transfer transistor a plurality of times in a state where the overflow drain transistor is on-state and the second transfer transistor is off-state.

11. A control method of a photoelectric conversion apparatus including a photoelectric conversion unit, a charge accumulation unit configured to accumulate charges generated in the photoelectric conversion unit, and a transfer transistor configured to connect the photoelectric conversion unit and the charge accumulation unit to each other and to perform a transfer operation of a charge from the photoelectric conversion unit to the charge accumulation unit, the method comprising:
acquiring a first signal by performing an on-off operation of the transfer transistor a plurality of times in a state where the charge accumulation unit is accumulating charges;
acquiring a second signal by performing an on-off operation of the transfer transistor a plurality of times in a state where the charge accumulation unit is not accumulating charges; and
outputting the first signal and the second signal.

12. The method according to claim 11, wherein the number of times the on-off operation of the transfer transistor is performed in order to acquire the first signal and the number of times the on-off operation of the transfer transistor is performed in order to acquire the second signal are the same.

13. The method according to claim 11, wherein an accumulation state of charges of the photoelectric conversion unit is controlled by switching between an on-state and an off-state of an overflow drain transistor which connects the photoelectric conversion unit and a power supply to each other.

14. The method according to claim 11, wherein an accumulation state of charges of the photoelectric conversion unit is controlled by opening and closing a shutter which blocks incidence of light to the photoelectric conversion unit.

15. The method according to claim 11, wherein a plurality of pixel units each including the photoelectric conversion unit, the charge accumulation unit, and the transfer transistor are two-dimensionally arranged, further comprising a step in which the photoelectric conversion units of the plurality of pixel units simultaneously start and end exposure.

16. The method according to claim 11, wherein a plurality of pixel unit each including the photoelectric conversion unit, the charge accumulation unit, and the transfer transistor are two-dimensionally arranged, further comprising a step in which the photoelectric conversion units of the plurality of pixel units line-sequentially start and end exposure.

17. The method according to claim 11, wherein the photoelectric conversion apparatus further includes a diffusion floating capacity configured to receive and hold the charges transferred from the charge accumulation unit; a second transfer transistor configured to connect the charge accumulation unit and the diffusion floating capacity to each other and to perform a second transfer operation of a charge from the charge accumulation unit to the diffusion floating capacity; and an overflow drain transistor configured to connect the photoelectric conversion unit and a power supply to each other,
wherein a state where the charge accumulation unit is accumulating charges is a state where the overflow drain transistor is on-state, and
wherein the on-off operation of the transfer transistor is performed a plurality of times in a state where the overflow drain transistor is on-state and the second transfer transistor is off-state.

* * * * *